Figure 1:
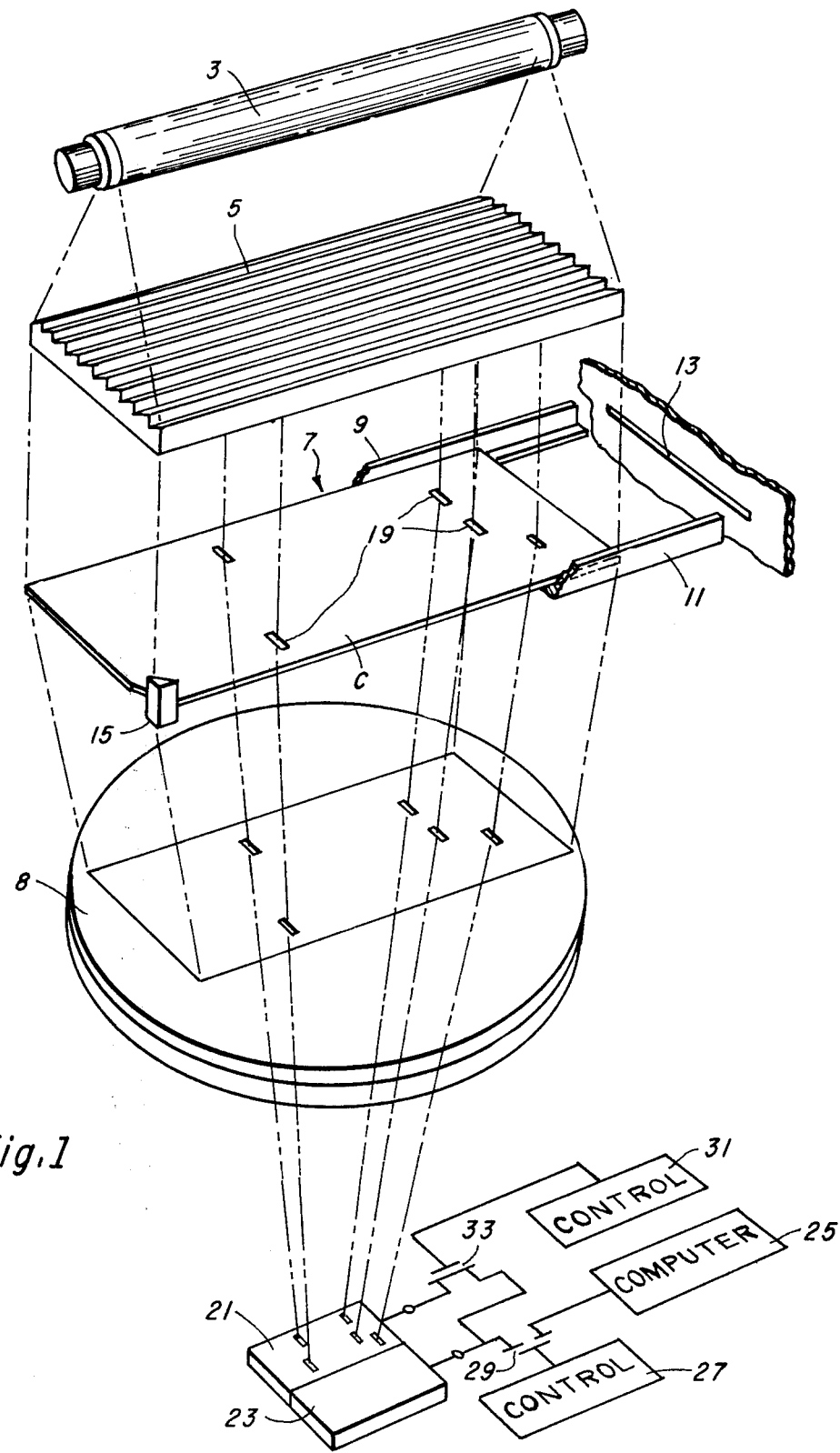

United States Patent [19]
Cragon

[11] 3,941,979
[45] Mar. 2, 1976

[54] READ ONLY MEMORY

[75] Inventor: Harvey George Cragon, Austin, Tex.

[73] Assignee: Texas Instruments Incorporated, Dallas, Tex.

[22] Filed: Sept. 3, 1974

[21] Appl. No.: 502,471

[52] U.S. Cl. ..... 235/61.11 E; 250/555; 340/173 LS; 340/173 LM

[51] Int. Cl.². G06K 7/10; G08C 9/06; G11C 11/34

[58] Field of Search...... 235/61.11 E; 250/555, 566, 250/568, 569; 340/173 LS, 173 LM, 173 LT

[56] References Cited
UNITED STATES PATENTS

| | | | |
|---|---|---|---|
| 3,750,114 | 7/1973 | Valassis | 340/173 LM |
| 3,864,550 | 2/1975 | Cragon | 340/173 LS |

*Primary Examiner*—Daryl W. Cook
*Attorney, Agent, or Firm*—Harold Levine; James T. Comfort; Richard L. Donaldson

[57] ABSTRACT

The disclosure relates to a charge coupled device (CCD) read only memory (ROM) capable of storing the data stored in a punch card or photographic film and reading same out on commands.

This is accomplished by providing a charge coupled imager, which may be of standard design, with frames arranged in a rectangular array to coincide with the regions in the card or film, in which holes are capable of being punched or slots on the photographic film will appear. The total size of the frames on the charge coupled device imager can be made large enough relative to the focused image from the punched card or film so that rotational and translational misalignments of the card or film will not produce errors. The reader includes a card or film holder for properly aligning the card or film with respect to the frames of the imager, an optical source which includes a light and a lens or optical system to properly illuminate all the possible hole locations on the punched card or film. In this way, light impinges on those frames of the imager wherein holes have been punched in the card or appropriate spots appear on a film, the imager then transforming the charges in the locations wherein light impinges to a buffer storage region of the CCD to provide the storage function on command. The data is then shifted out of the CCD buffer region, on command, in standard manner onto a transmission line or the like to travel to a computer for operation therein and is also recirculated, if desired, to the optical integration section of the imager.

3 Claims, 2 Drawing Figures

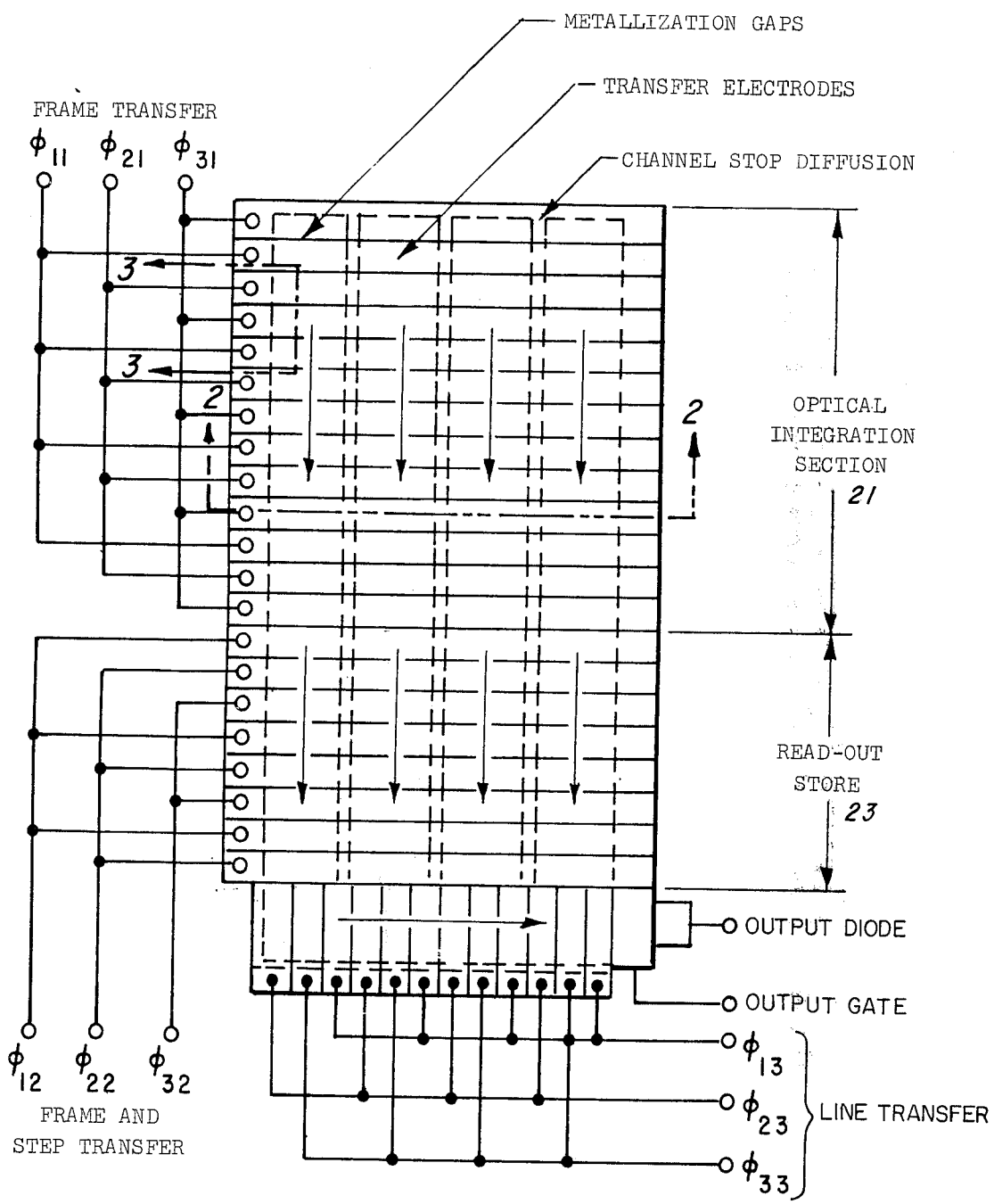

READ ONLY MEMORY

This invention relates to a charge coupled device (CCD read only memory (ROM) system and, more specifically, to such a system which performs the combined functions of sensing the presence of holes or the like in a card or film and buffering the data indicative of said holes in a storage region on command and reading out and/or recirculating the data on command.

With the continued miniaturization of electronic components, particularly in the field of semiconductors, and with the further increased use and development of semiconductor storage devices, it is desirable to provide the art with storage devices having maximum storage capacity relative to size and which are compatible with the miniaturized semiconductor systems with possible simultaneous fabrication therewith. The charge coupled device (CCD) appears to offer great possibilities for use as a storage device for data. In accordance with the present invention, there is provided a read only memory (ROM) which is capable of utilizing this new technology and providing a very small memory device which is capable of read out on command and wherein the stored data can easily be changed by changing of an external card or film onto which the data stored in the ROM is initially stored. Therefore, a compact ROM is provided wherein the stored data can quickly and easily be altered, as desired.

Briefly, the above is provided by utilizing a charge coupled imager, which may be of standard design, with frames arranged in a rectangular array to coincide with the regions in the card in which holes are capable of being punched or spots are positioned on a photographic film. The total size of the frames on the charge coupled device imager can be made large enough relative to the focused image of the punched card so that rotational and translational misalignments of the card will not produce errors. The reader includes a card or film holder for properly aligning the card or film with respect to the frames of the imager and an optical source which includes a light and a lens or optical system to properly illuminate all the possible hole locations on the punched card or film. In this way, light impinges on those frames of the imager wherein holes have been punched in the punched card, the imager then transforming the charges in the locations wherein light impinges to a buffer storage region of the CCD to provide the storage function on command. The data is then shifted out of the CCD buffer region, on command, in standard manner and then placed onto a transmission line or the like for feeding to a computer and is also recirculated, if desired, to the optical integration section of the CCD device.

It is therefore an object of this invention to provide a charge coupled device read only memory system.

It is a further object of this invention to provide a charge coupled device read only memory system wherein information is placed into the memory system by means of an external optical device.

It is a yet further object of this invention to provide a charge coupled device read only memory system wherein data stored on a punched card or film is transferred into the charge coupled device ROM for storage therein and later reading out therefrom to an external device.

The above objects and still further objects of the invention will immediately become apparent to those skilled in the art after consideration of the following preferred embodiment thereof, which is provided by way of example and not by way of limitation, wherein:

FIG. 1 is a schematic diagram of a CCD read only memory system in accordance with the present invention; and FIG. 2 is schematic diagram of prior art charge-transfer image sensing array for use in accordance with the present invention.

Referring now to FIG. 1, there is shown a charge coupled device read only memory embodying the present invention. The system includes a lamp 3 and an optical system comprising lens 5 which spreads the light from the lamp 3 over the entire card region 7 so that the light travels in the direction normal to the plane of the card region 7. To properly position a card in the card region 7, there is provided a card holder including a pair of guides 9 and 11, there also being a slot 13 which would be part of a housing (not shown) for insertion of the card into the guides 9 and 11 in a bevelled corner 15 to mate with a similar bevelled corner on a card for proper positioning of the card within the card holding region 7. It should be understood at this point that though a punched card is being described with respect to the preferred embodiment, a film having spots thereon to represent the existence of holes on a card could also by used in place of the card. A focusing lens 8 is located below the card region 7. The card holder maintains a card located therein in a flat disposition so that light passing through holes in the card will be focused by the lens 8 onto the proper locations of the optical integration section of a charge coupled device imager 21 with which the holes are required to be aligned.

The card reader is operated by placing a card C through the slot 13 onto the guides 9 and 11 until properly located by the bevelled corner 15, and then turning on the light 3 whereupon the light passes through the holes in the card C, the light passing through the holes 19 in the card and being focused and impinging upon associated CCD imager 21. In the manner to be described hereinbelow, the light focused on the CCD imager 21 will cause charges to be stored in the appropriate location in the imager whereupon the imager stores sets of charges indicative of those locations in the card wherein holes have been punched.

Upon providing proper signals, as will be discussed in more detail with respect to FIG. 2, the data stored in the optical integration section 21 is read into the read out store section 23 of the CCD imager. This information can then be read out serially to a computer 25 by operation of a control 27 which controls a transistor 29 and allows the data to pass to the computer. The control 27 can be any desirable control device, many of which are known in the prior art. The data stored in the read out store section 23 can also be recirculated back to the optical integration section by operation of a control 31 which would be similar to the control 27 and independently operated. This control 31 would operate a transistor 33 for allowing recirculation of the data back into the optical integration section 21. The control circuits 27 and 31 may each comprise an AND gate as shown in FIG. 1. The control circuit 27 AND gate would receive as inputs a TRANSMIT-TO-COMPUTER signal and the inverse of a RECIRCULATE signal. The control circuit 31 AND gate would receive as inputs the RECIRCULATE signal and the inverse of the TRANSMIT-TO-COMPUTER signal. Such an arrangement would insure the above-mentioned independent operation of the control units 27 and 31.

Referring to FIG. 2, there is shown a schematic diagram of the "frame-transfer" method of organizing a charge-transfer image sensing array as set forth in "Charge-Transfer Devices", M. F. Tompsett et al, Journal of Vacuum Science and Technology, Vol. 9, No. 4, July – August 1972. The array includes, in the optical integration section, frame transfer lines for clocking pulses $\phi_{11}$, $\phi_{21}$, and $\phi_{31}$ with provide the well known three phases of transfer (as discussed in the above noted article) the metallization gaps, the transfer electrodes and the channel stop regions (conveniently formed by diffusion) between the rows of transfer electrodes. The portion of the array labeled "read-out store" includes frame and step transfer lines for clocking pulse input $\phi_{12}$, $\phi_{22}$, and $\phi_{32}$ as well as the line transfer lines for clock pulse inputs $\phi_{13}$, $\phi_{23}$ and $\phi_{33}$, an output diode and an output gate. In conjunction with the phase transfer signals, charge stored under designated electrodes in the optical integration section can be transferred in a shift register manner as is well known in the art into the readout store section prior to read out through the output diode and the output gate.

The optical integration section of FIG. 2 would correspond to the charge coupled imager section 21 which is positioned beneath the card region 7 shown in FIG. 1, the read-out store corresponding to section 23 adding a buffering or storage operation wherein the data read from a card can be stored while a new card is being placed into the card holder or for later recirculation as described above. By appropriate application of the frame and step transfer clock pulses $\phi_{12}$, $\phi_{22}$ and $\phi_{32}$, the data in the read-out store can then be transferred to the output and then to a transmission line.

It can be seen that there has been disclosed a system for storing and reading out data formed in cards or film by means of holes or the like utilizing a charge coupled device imager which provides the simultaneous functions of sensing the presence of punched holes as well as storing the data prior to transfer of the data on command to a computer.

The specific operation of the CCD device will not be discussed herein since the operation thereof is well known in the art and fully described in the above-noted literature.

Though this invention has been described with respect to a specific preferred embodiment thereof, many variations and modifications thereof will immediately become apparent to those skilled in the art. It is therefore the intention that the appended claims be interpreted as broadly as possible in view of the prior art to include all such variations and modifications.

What is claimed is:

1. A charge coupled device read only memory, which comprises:
   a. means for holding data bearing cards with predetermined alignment, said cards having locations thereon wherein data images have been formed in a predetermined pattern;
   b. a charge coupled imager having an optical integration portion with a plurality of frames and a storage portion;
   c. means for directing light through said data images in the data bearing card and for focusing said light on corresponding frames of said charge coupled imager, said frames of the charged coupled imager having a total area greater than the focused area of the punched card, and
   d. means selectively operable by external signals to transfer data from said storage portion to an external device or to recirculate data from said data storage portion to said optical integration portion.

2. A charge coupled device read only memory as set forth in claim 1 wherein said data bearing card is a punched card.

3. A charge coupled device read only memory as set forth in claim 1 wherein said data bearing card is a photographic film with opaque and transparent regions therein.

* * * * *